(12) United States Patent
Parkin et al.

(10) Patent No.: US 6,518,588 B1
(45) Date of Patent: Feb. 11, 2003

(54) MAGNETIC RANDOM ACCESS MEMORY WITH THERMALLY STABLE MAGNETIC TUNNEL JUNCTION CELLS

(75) Inventors: Stuart S. P. Parkin, San Jose, CA (US); Mahesh G. Samant, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/982,576

(22) Filed: Oct. 17, 2001

(51) Int. Cl.[7] .............................................. H01L 47/00
(52) U.S. Cl. .............................. 257/3; 257/9; 257/285; 257/300
(58) Field of Search ...................... 204/192.15, 192.17, 204/192.2; 257/3, 9, 295, 296, 300; 360/113, 126, 324.11; 365/48, 55, 66, 158, 171; 428/65.3, 65.7, 457, 469, 693

(56) References Cited

U.S. PATENT DOCUMENTS

| | | | |
|---|---|---|---|
| 5,281,485 A | * 1/1994 | Colgan et al. | 204/192.15 |
| 5,341,118 A | 8/1994 | Parkin et al. | 338/32 R |
| 5,608,593 A | * 3/1997 | Kim et al. | 360/324.12 |
| 5,640,343 A | * 6/1997 | Gallagher et al. | 365/171 |
| 5,801,984 A | * 9/1998 | Parkin | 365/158 |
| 5,841,692 A | 11/1998 | Gallagher et al. | 365/173 |
| 5,898,547 A | * 4/1999 | Fontana et al. | 360/321 |
| 6,097,625 A | 8/2000 | Scheuerlein et al. | 365/171 |
| 6,153,320 A | * 11/2000 | Parkin | 427/131 |
| 6,174,582 B1 | * 1/2001 | Bian et al. | 204/192.2 |
| 6,295,186 B1 | * 9/2001 | Hasegawa et al. | 360/324.11 |
| 6,297,983 B1 | * 10/2001 | Bhattacharyya | 365/157 |

OTHER PUBLICATIONS

J. M. Slaughter et al., *Magnetic Tunnel Junction Materials for Electronic Applications*, Jun. 2000 Issue of JOM, pp. 1–11. Http://www.tms.org/pubs/journals/JOM/0006/Slaughter/Slaughter–006.h.

* cited by examiner

*Primary Examiner*—David Nelms
*Assistant Examiner*—Dao H. Nguyen
(74) *Attorney, Agent, or Firm*—Thomas R. Berthold

(57) ABSTRACT

A magnetic tunnel junction (MTJ) memory cell and a magnetic random access memory (MRAM) incorporating the cells has upper and lower cell electrodes that are formed of bilayers that provide electrical connection between the cells and the copper word and bit lines of the MRAM. The bilayers are formed of a first layer of tantalum nitride or tungsten nitride and a second layer of tantalum or tungsten. In one embodiment TaN is formed directly on the copper and low-resistivity alpha-Ta is formed directly on the TaN. If the cells use an antiferromagnetic layer to fix the moment of the pinned ferromagnetic layer, then Pt—Mn is the preferred material formed over the alpha-Ta. The bilayer can function as a lateral electrode to connect a horizontally spaced-apart cell and a copper stud in the MRAM.

9 Claims, 3 Drawing Sheets

MAGNETIC RANDOM ACCESS MEMORY WITH THERMALLY STABLE MAGNETIC TUNNEL JUNCTION CELLS

STATEMENT OF GOVERNMENT RIGHTS

The United States Government has a paid-up license in this invention and the right in limited circumstances to require the patent owner to license others on reasonable terms as provided for by the terms of contract No. MDA 972-96-C0030.

TECHNICAL FIELD

This invention relates generally to magnetic tunnel junction (MTJ) magnetic memory cells and more particularly to nonvolatile magnetic random access memory (MRAM) devices formed from an array of MTJ memory cells.

BACKGROUND OF THE INVENTION

Magnetic tunnel junctions (MTJ) are promising candidates for nonvolatile memory storage cells to enable a dense, fast, nonvolatile magnetic random access memory (MRAM) array. An MTJ-based MRAM has the potential to rival conventional DRAM in density and cost, and conventional SRAM in speed. In addition, MRAM is truly nonvolatile. However, for MTJ-MRAM to replace conventional semiconductor memory technologies it is essential that the materials making up the MTJ cells be compatible with conventional complementary metal oxide semiconductor (CMOS) processing. This compatibility is necessary because the MTJ memory cells will be built on CMOS circuits which are required to read and write the state of the MTJ cells. Thus, suitable MTJ materials will be those which can successfully withstand the rigors imposed in CMOS wafer processing. MTJ-MRAM arrays are described in IBM's U.S. Pat. Nos. 5,640,343 and 6,097,625.

An MTJ comprises two ferromagnetic layers separated by a thin insulating layer, wherein the conductance through the layers depends on the relative orientation of the magnetic moments of the ferromagnetic layers. The most useful MTJ for memory cells has the magnetic moment of one of the ferromagnetic layers free to rotate and the magnetic moment of the other ferromagnetic layer fixed or pinned by being exchange-biased with a thin antiferromagnetic layer The main CMOS processing concern is that the MTJ materials have sufficient thermal stability to withstand back-end-of-line anneal treatments performed at a temperature in the range of approximately 350 to 400° C. in a forming gas.

The thermal stability of the MTJ cell is affected by the cell underlayer and capping layer. The capping layer is in direct contact with the free ferromagnetic layer and thus needs to be non-interacting with the material of the free ferromagnetic layer. The underlayer is located between one of the conductor lines of the MRAM and the MTJ cell. It can be in direct contact with the conductor line or on top of a via, and thus must be capable of growing on top of copper, as well as possibly $SiO_2$ and $Si_3N_4$ or other insulating dielectrics. The thermal stability of the MTJ cell is also affected by the material chosen for the antiferromagnetic layer. While $Mn_{50}Fe_{50}$ is a common antiferromagnetic material, it does not have high thermal stability, and MTJ cells using this alloy exhibit decreased magnetoresistance (MR) when annealed at temperatures as low as 250° C. The antiferromagnetic material is grown on the cell underlayer and thus must also be compatible with the underlayer material during CMOS processing.

Another CMOS processing concern is the requirement that the materials making up the MTJ cell are amenable to reactive ion etching and/or wet chemical etching.

A general review of materials and processes for MTJ-MRAM is presented in an on-line article by J. M. Slaughter et al, "Magnetic Tunnel Junction Materials for Electronic Applications", JOM-e (electronic publication of *The Minerals, Metals & Materials Society*) 52 (6) (June, 2000).

What is needed is an MTJ cell with a set of materials that allows high MR while being fully compatible with CMOS processing steps.

SUMMARY OF THE INVENTION

The invention is a MTJ cell and a MRAM incorporating the cells. The upper and lower electrodes of each cell are formed of bilayers that provide electrical connection between the cell and the copper word and bit lines of the MRAM. The bilayers are formed of a first layer of tantalum nitride or tungsten nitride and a second layer of tantalum or tungsten. In one embodiment TaN is formed directly on the copper and low-resistivity alpha-Ta is formed directly on the TaN. If the cells use an antiferromagnetic layer to fix the moment of the pinned ferromagnetic layer, then Pt—Mn is the preferred material formed over the alpha-Ta. The bilayer can function as a lateral electrode to connect a horizontally spaced-apart cell and a copper stud in the MRAM. With this combination of materials each cell and thus the MRAM has high thermal stability compatible with CMOS processing.

For a further understanding of the nature and advantages of the present invention, reference should be made to the following detailed description taken together with the accompanying figures.

DETAILED DESCRIPTION OF THE INVENTION

Prior Art MTJ Array

Figure 1A:
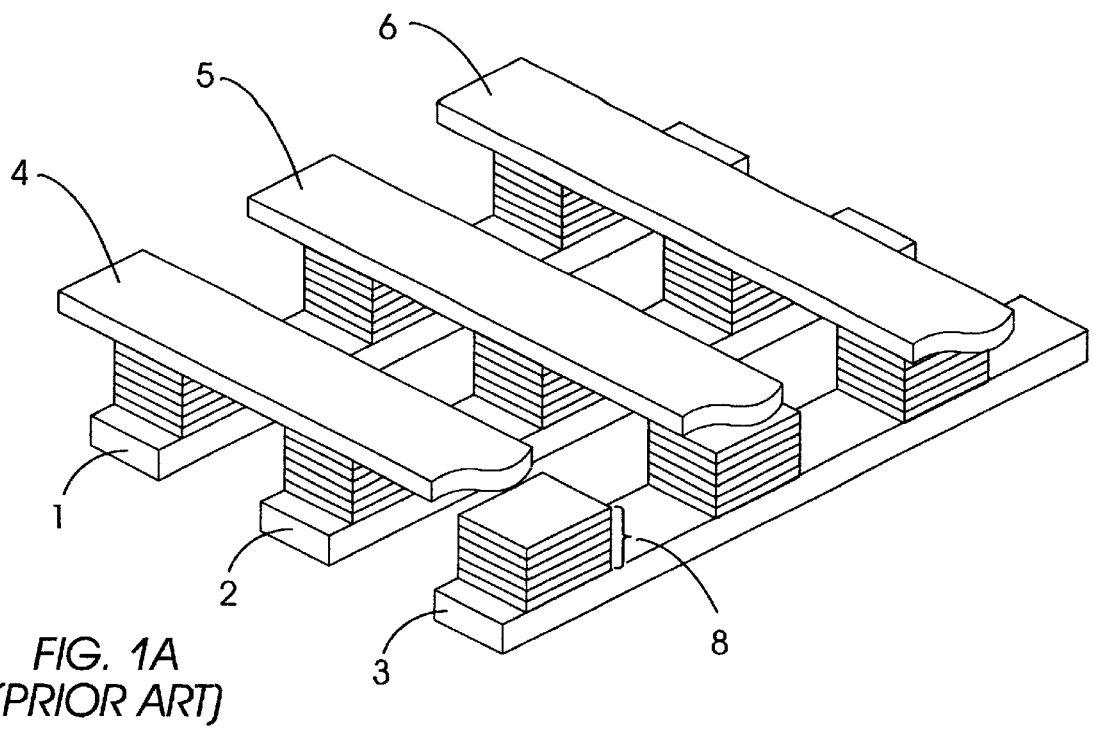
FIG. 1A depicts a prior art MTJ type of MRAM array having magnetic memory cells disposed at the intersecting regions of crossing sense lines and word lines.
Figure 1B:
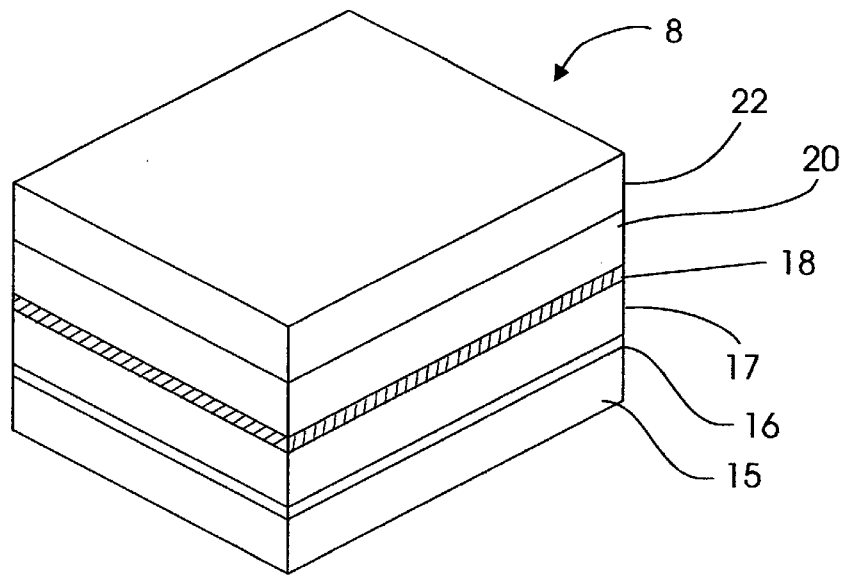
FIG. 1B depicts exemplary layers forming a single one of the MTJ memory cells of the prior art MRAM array of FIG. 1A.

An example of an MTJ MRAM array is shown in FIG. 1A, wherein the MTJ cells are positioned at the intersections of an exemplary rectangular grid of electrically conductive lines 1–6. The MRAM array includes a set of electrically conductive lines that function as parallel word lines 1, 2, and 3 in a horizontal plane, and a set of electrically conductive lines that function as parallel bit or sense lines 4, 5, and 6 in another horizontal plane. The sense lines are oriented in a different direction, e.g., at right angles to the word lines, so that the two sets of lines intersect when viewed from above. A MTJ memory cell, such as typical memory cell 8 shown in detail in FIG. 1B, is located at each crossing point of the word lines and sense lines near an intersection region between the vertically spaced sets of lines. Three word lines and three sense lines are illustrated in FIG. 1A, but the number of lines would typically be much larger. The memory cell 8 is arranged as a vertical stack of layers. During a sensing or reading operation of the array, current flows in a vertical direction through the cell 8. The vertical current path through the memory cell permits the memory cell to occupy a very small surface area. The array is formed on a substrate, such as a silicon-on-insulator (SOI) substrate which contains other circuitry.

As shown in FIG. 1B, the MTJ 8 is formed of a series of layers of material stacked one on top of the other. The MTJ 8 of FIG. 1B comprises an underlayer 15, such as tantalum (Ta), an antiferromagnetic (AF) layer 16, such as Mn—Fe, a fixed or pinned type of ferromagnetic layer 17 that is exchange coupled to the AF layer 16, a thin insulating tunnel barrier layer 18, which is typically alumina ($Al_2O_3$), a free ferromagnetic layer 20, and a capping layer 22, which may also be Ta.

Preferred Embodiments

Figure 2:
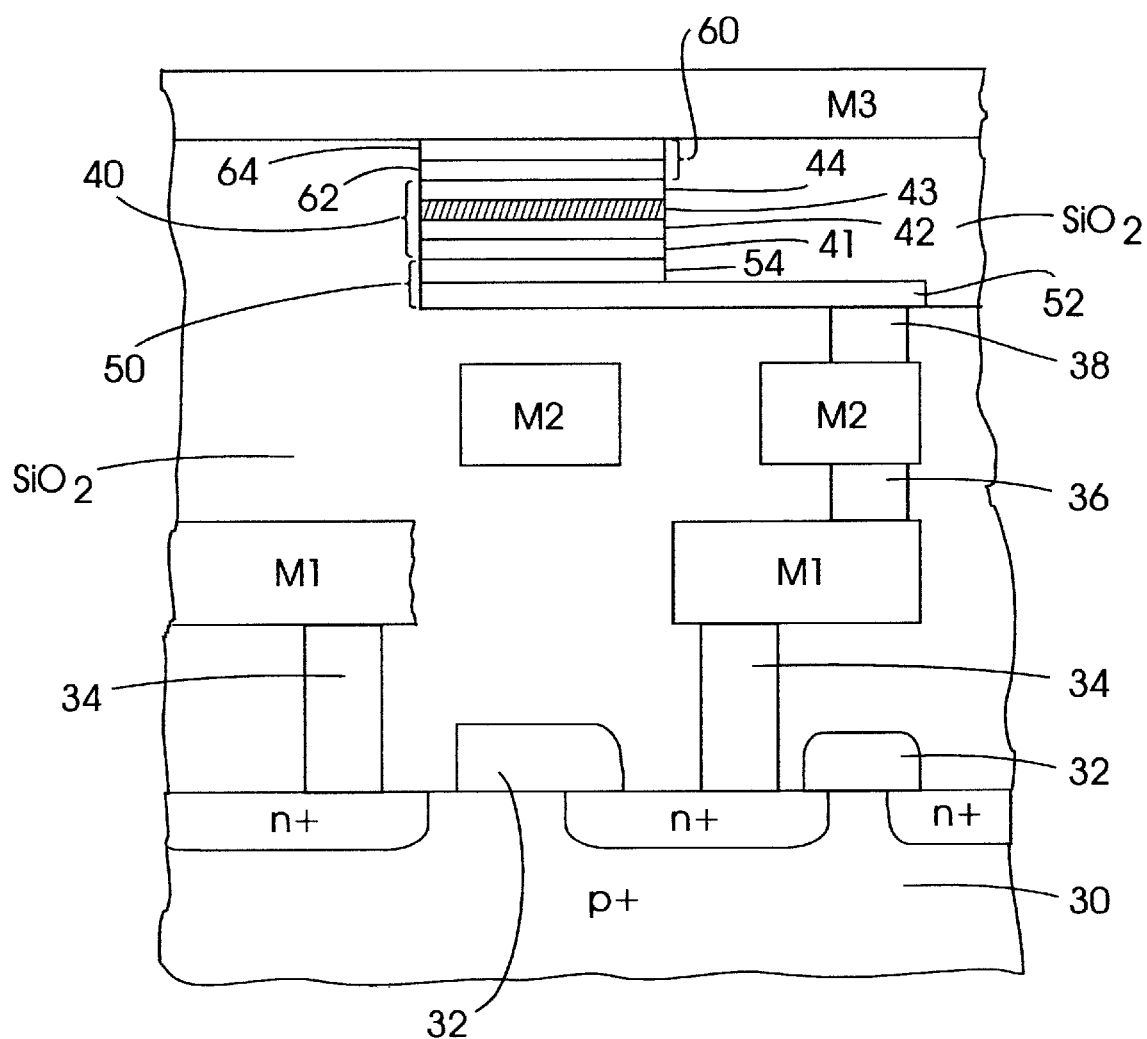
FIG. 2 is a sectional view of an MTJ cell according to the present invention embedded within an MRAM array.

FIG. 2 illustrates an MTJ according to the present invention illustrated in cross-section as part of an MRAM structure. The planar substrate 30 of the MRAM is p+ silicon with n+ regions connected by polysilicon gates 32. The bottom portion of MTJ 40 is located on underlayer 50 and is electrically connected to an n+ region by metallization layers M2 (the write word line), M1 and interconnecting conductive studs 34, 36, 38. The studs are formed in vias in the surrounding $SiO_2$ insulating material. The top portion of MTJ 40 is covered by overlayer or capping layer 60 and is electrically connected to metallization layer M3, the sense line or bit line. The lines M3 and M2 are representative lines in sets of lines that are vertically spaced from the planar substrate 30. The two sets of lines are vertically spaced from each other so that the regions where they cross define intersection regions where the MTJs are located.

The MTJ 40 includes a platinum-manganese (Pt—Mn) antiferromagnetic layer 41, a pinned ferromagnetic CoFe alloy layer 42, an alumina ($Al_2O_3$) insulating tunnel barrier layer 43, and a free ferromagnetic NiFe alloy layer 44. The MTJ cell may be considered to include, in addition to MTJ 40, the underlayer 50 and the capping layer 60. In the present invention, the underlayer 50 is a bilayer comprising a low-resistivity alpha-tantalum (Ta) layer 54 formed on a tantalum nitride (TaN) seed layer 52. The TaN layer 52, as illustrated in FIG. 2, is deposited on both the $SiO_2$ insulating material and on the stud 38 which provides an electrical connection to word line M2. The capping layer 60 is a bilayer comprising a TaN layer 62 formed on the free ferromagnetic layer 44 and a alpha-Ta layer 64 between the TaN layer 62 and the bit line M3. Because the studs and metallization layers are preferably formed of copper (Cu), the Ta and TaN must be non-reactive with Cu. Also, the Ta must be non-reactive with Pt—Mn, the preferred antiferromagnetic material of layer 41.

The TaN layer 52 and the Ta layer 54 can each have thicknesses in the range of 25 Å to several hundred angstrom. The thickness range is selected on the basis of several criteria including, most importantly the need to have both the word line M2 and the bit line M3 as close as possible to the free ferromagnetic layer 44. The direction of the magnetic moment of the free ferromagnetic layer 44 with respect to that of the direction of the magnetic moment of the pinned ferromagnetic layer 42 determines the state of the memory cell. The magnetic moment of the free ferromagnetic layer is designed to be either parallel or antiparallel to that of the pinned ferromagnetic layer in the two states of the memory cell. The orientation of the magnetic moment of the free ferromagnetic layer is set by passing currents through the word and bit lines, which generate magnetic fields at the free layer moment. Since the magnitude of the magnetic field for a given current through the word or bit line falls off with distance from these lines, it is preferred, to minimize power consumption, to have the minimum possible distance between the free ferromagnetic layer 44 and the word and bit lines directly below and above it. Thus the thickness of the underlayer 50 and capping layer 60 should be made as small as possible. On the other hand, the thickness of the underlayer 50 must be sufficiently large that the layer 52 which provides an electrical connection between the MTJ 40 and the stud 38 can support the necessary electrical current which must be passed through the MTJ cell to read the state of the cell. This current is much smaller than the currents which are passed through the write and bit lines to change the magnetic state of the cell. If the layer 52, which functions a lateral electrode for MTJ 40, is too thin then excessive energy will be dissipated in this layer since the resistance of this layer will vary approximately inversely with its thickness. There may also be an excessive voltage drop along this layer which, for low voltage CMOS may be detrimental to the performance of the memory. Thus, the layer 54 may also extend along the length of the layer 52 to reduce the resistance of this electrical connection between the horizontally spaced-apart MTJ 40 and the stud 38. Since the Ta layer 54 which is formed on the TaN layer 52 has an electrical conductivity which is approximately 10–20 times higher than that of TaN there may be a particular advantage to extending layer 54 along the extent of layer 52 so that both layers 52 and 54 function as the lateral electrode connecting MTJ 40 with stud 38.

Experimental Results

MTJ structures were prepared on Si substrates with 100–500 nm thick thermally oxidized $SiO_2$ in a high vacuum chamber with a base pressure of $\sim 2\times 10^{-9}$ Torr. The materials were sequentially deposited by magnetron sputtering in $3\times 10^{-3}$ Torr of Argon (although a range of sputtering pressures was also studied). Typically, the Pt—Mn antiferromagnet was ~30 nm thick, the pinned ferromagnetic layer was 2.4 nm of $Co_{84}Fe_{16}$, the tunnel barrier was 1.3 nm Al (plasma oxidized), and the free ferromagnetic layer was typically 10 nm of $Ni_{81}Fe_{19}$. The deposited aluminum layer was oxidized to create the alumina tunnel barrier by plasma oxidation for approximately for 120 seconds in the presence of 0.1 Torr of oxygen. Note that the pinned layer 42 may also be formed from an artificial antiferromagnetic (AAF) sandwich comprised of, for example, thin layers of $Co_{84}Fe_{16}$ separated by ultra thin layers of nonferromagnetic ruthenium layers, as described in IBM's U.S. Pat. No. 5,841,692.

The TaN layer was 5 nm and the Ta layer was 10 nm. The TaN layer was deposited in a manner consistent with previously established procedures and in particular by use of reactive sputtering of Ta in $Ar+N_2$ mixture. The process for depositing alpha-Ta on a TaN seed layer is described in detail in IBM's U.S. Pat. No. 5,281,485 which is incorporated herein by reference. Several $Ar/N_2$ mixtures were tried and the deposited TaN films were analyzed for nitrogen content with Rutherford backscattering (RBS). Increased nitrogen content of the $Ar/N_2$ sputtering gas mixture leads to an increased nitrogen content in the TaN films. The resistivity of the films is also critically dependent on the nitrogen content.

Figures 3A, 3B:
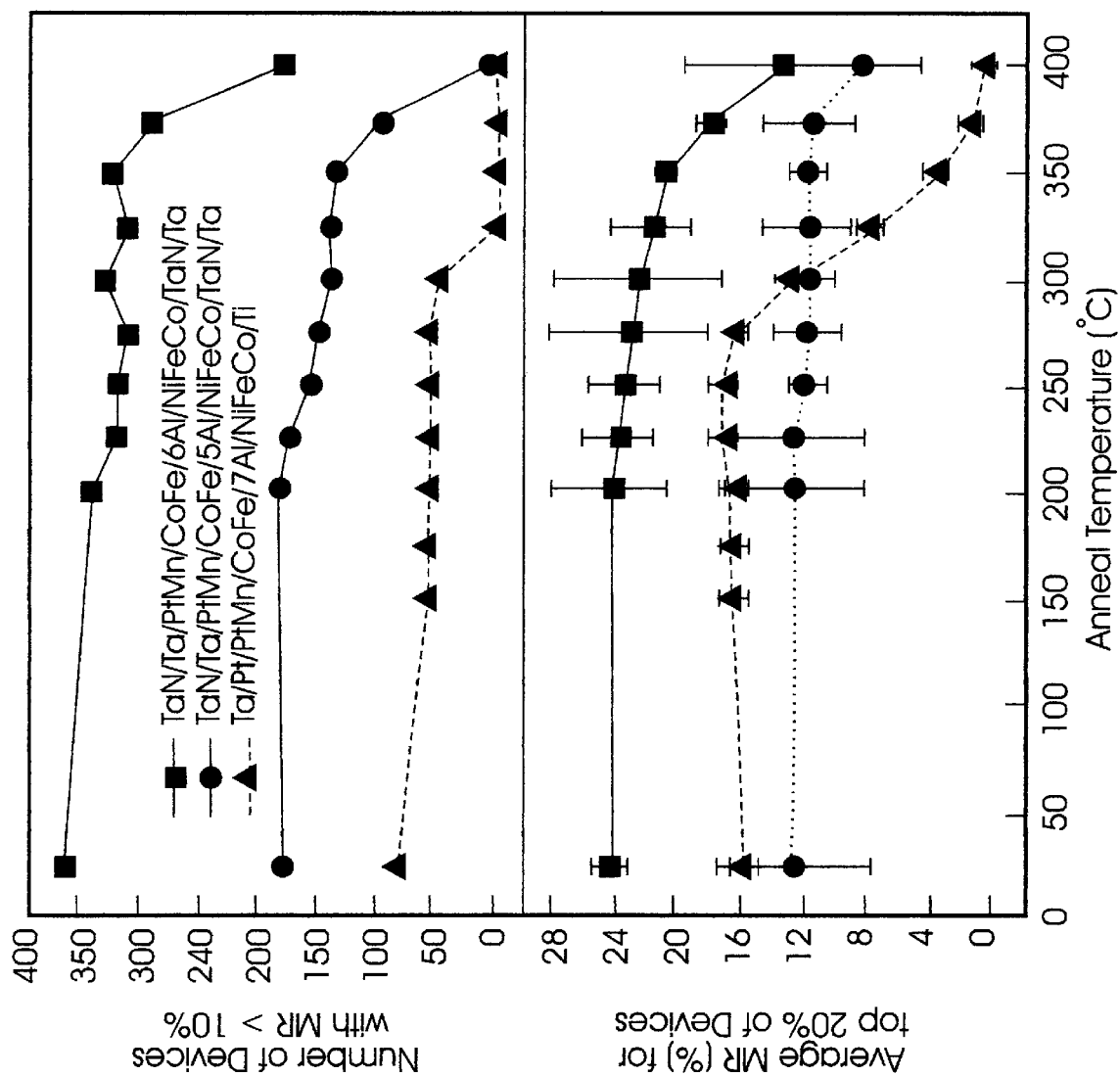
FIG. 3A shows the effect of anneal temperature on the number of MTJ structures with MR greater than 10% for lithographically patterned MTJ structures with TaN/Ta underlayers and capping layers, and for similar MTJ structures but with a Ta/Pt dual underlayer and a titanium (Ti) capping layer.
FIG. 3B shows the effect of anneal temperature on the average MR of the top 20% of all devices, determined on basis of the MR values, for lithographically patterned MTJ structures with TaN/Ta underlayers and capping layers, and for similar MTJ structures but with a Ta/Pt dual underlayer and a titanium (Ti) capping layer.

FIGS. 3A–3B shows thermal anneal results obtained from lithographically patterned MTJ structures with TaN/Ta underlayers and capping layers, and for similar MTJ structures but with a Ta/Pt dual underlayer and a titanium (Ti) capping layer (triangle data points). The annealing process consisted of sequential steps of temperature ramp-up, soak at the anneal temperature for 15 minutes, and cool to room temperature. This was followed by MR measurements made at room temperature. These anneal studies were made on a Micromanipulator Probe station, which is an apparatus designed to make electrical connections to patterned structures on wafers by applying contact pins to conducting contact pads on the wafer. The apparatus was specially modified so that magnetic fields in the plane of the magnetic tunnel junction devices could be applied in either or both of two orthogonal directions (the x and y directions). The apparatus also allowed the wafer to be heated to elevated temperatures so that the MTJ devices could be annealed at an elevated temperature and then subsequently measured electrically. Thus magneto-transport data can be collected successively on a set of MTJ devices on one wafer both before and after annealing the devices at temperatures of up to 400° C. Each wafer was lithographically patterned using a combination of optical and e-beam lithography to create over 500 MTJ device structures of varying shapes and sizes which could be measured on the prober apparatus.

FIG. 3A summarizes how the number of devices with MR>10% varies with anneal temperature. The samples with TaN/Ta in both underlayer and capping layer have a significant number of devices which have MR>10% even after the 400° C. anneal. The sample with Ta/Pt underlayer and a Ti capping layer does not perform well in the thermal anneal studies and shows that there were no devices with MR>10% at temperatures over 325° C.

FIG. 3B shows average MR for the top 20% of the MTJ structures as determined on the basis of their MR values. The average MR goes down as a function of anneal temperature. For one set of samples the decrease is from 24% to 14% whereas for the other set of samples the decrease is from 13% to 9%. The set of samples with the Ta/Pt underlayers and Ti capping layers shows MR approximately 0% after 400° C. anneal. These studies establish that an MTJ with a TaN/Ta underlayer and a capping layer, in combination with a Pt—Mn antiferromagnetic layer, provides a highly thermally stable MTJ that allows the fabrication of an MTJ-MRAM using standard CMOS processes.

The above data also has established that certain classes of materials, such as Ti and perhaps titanium nitride (TiN), would be unlikely to function as suitable underlayers and capping layers to give a highly thermal stable MTJ.

The underlayers must have a combination of several characteristics. In particular the underlayers must enable the growth of very smooth exchange bias layers on which the pinned ferromagnetic layer, tunnel barrier and free ferromagnetic layers are deposited. Similarly the underlayers must act as a thermal diffusion barrier for copper from the underlying copper wires when the MTJs are grown directly on copper wires in a simple cross-point MRAM architecture. The underlayers must also adhere well to either copper wires or to an insulating dielectric layer, depending on the details of the MRAM architecture. For the MRAM architecture shown in FIG. 2 where the MTJ 40 is connected to a transistor by a lateral or horizontal electrode, the the layer 52 that also forms the lateral electrode must have sufficient electrical conductivity so that no significant voltage is dropped across the lateral electrode. An important characteristic of the materials 62 and 64 of capping layer 60 is that the layer 62 must not react with or interdiffuse with the free ferromagnetic layer 44. Similarly the combination of the layers 62 and 64 must provide a thermal diffusion barrier against copper in the wiring layer M3 reacting with the MTJ device. Finally these materials must not react with the dielectric material in which they are encapsulated. The TaN/Ta combination satisfies all of these requirements.

Other materials which satisfy these requirements include $Ta_2N$, or the tungsten nitrides WN and $W_2N$. Some of these other nitrides have much lower resistivity values than TaN and therefore may be preferred for use as the lateral electrode 52. These nitrides may be used in combination with W or Ta layers. A particular advantage of TaN in combination with Ta is the growth of the low resistivity alpha phase of Ta when deposited on top of TaN.

Tantalum often reacts with ferromagnetic layers at elevated temperatures but TaN forms a much more thermally stable layer. Reaction of the layer 62 with the free ferromagnetic layer 44 may result in significant changes in the magnetization and/or the coercivity of the free ferromagnetic layer. Since the magnetic switching characteristics of the free ferromagnetic layer for small devices are very sensitive to the moment of the free ferromagnetic layer and its coercivity it is very important to form the layer 62 from a material which does not react or interdiffuse with the free layer and which also provides a thermal diffusion barrier for materials deposited on top of layer 62.

While the combination of the TaN/Ta underlayer with the Pt—Mn antiferromagnetic layer gave excellent thermal stability results, as described below, other antiferromagnetic materials, such as Pd—Pt—Mn or Os—Mn or Ir—Os—Mn alloys or any antiferromagnetic material with a sufficiently high blocking temperature which does not react with the underlayer comprised of TaN, or TaN/Ta may also be used. Similarly the antiferromagnetic layer 41 must be sufficiently thermally stable that its constituent elements do not diffuse from the antiferromagnetic layer 41 towards the tunnel barrier 43 and thereby cause a decrease in the magnetoresistance of the MTJ device. Typically Ir—Mn is less thermally stable than Pt—Mn or Pd—Pt—Mn alloys because the heat of formation of the Pt—Mn or Pd—Pt—Mn alloy is greater than that for the Ir—Mn alloy. The composition range of these antiferromagnetic alloys is that for which the alloy is antiferromagnetic. For example $Ir_xMn_{1-x}$ alloys are antiferromagnetic in a wide composition range for Ir ranging from a few to 35 atomic percent but the antiferromagnetic ordering temperature is reduced for very low Ir content so a preferred Ir composition range is from 20–30 atomic percent. For $Pt_xMn_{1-x}$ the composition range for antiferromagnetic ordering is very limited in the range of Pt content between about 46–48 atomic percent. Similarly Pd—Pt—Mn alloys have a very limited range of composition for which the alloys are antiferromagnetic.

Tantalum nitride itself is useful over a wide range of nitrogen content ranging from $Ta_2N$ to TaN, i.e., Ta between 33 and 50 atomic percent. The tantalum nitride layer can be formed by a wide variety of deposition processes including both physical vapor deposition and chemical vapor deposition. The combination of TaN/Ta and a Pt—Mn antiferromagnetic layer is preferred over TaN/Ta and Ir—Mn because the TaN/Ta/Pt—Mn combination gives a greater range of thermal stability compared to that of TaN/Ta/Ir—Mn.

Underlayers formed from TaN/Ta, which also acts as a thermal diffusion barrier, are also useful for magnetic tunnel junction devices formed without an antiferromagnetic layer. For example the pinned ferromagnetic layer may be made sufficiently magnetically robust by forming it from a sandwich of two ferromagnetic films separated by an antiferromagnetically coupling film such as Ru or Os. The Ru or Os spacer film, if of the required thickness, couples the two ferromagnetic films so that their moments are aligned antiparallel to one another, as described in IBM's U.S. Pat. No. 5,341,118. In a small patterned device with a sufficiently large aspect ratio the magnetostatic self field will maintain the orientation of the antiferromagnetically coupled sandwich. Alternatively, one of the ferromagnetic films in the sandwich can be formed from an alloy with a sufficiently larger magnetocrystalline anisotropy that the moment of this film, once set in a sufficiently large magnetic field, will remain immune to the comparatively small magnetic fields which are applied to the device to change the orientation of the free ferromagnetic layer. Thus the structure of this device is essentially the same as that shown in FIG. 2 without the antiferromagnetic layer 41 and where the pinned ferromagnetic layer 42 is formed from a pair of antiferromagnetically coupled ferromagnetic films.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A magnetic tunnel junction cell comprising:
    an electrically conductive underlayer comprising a first layer selected from the group consisting of a tantalum nitride and a tungsten nitride and a second layer selected from the group consisting of tantalum and tungsten located on and in contact with the first layer;
    a pinned ferromagnetic layer on the second layer of the underlayer;
    a free ferromagnetic layer having its magnetic moment free to rotate in the presence of an applied magnetic field;
    a tunnel barrier layer located between the pinned ferromagnetic layer and the free ferromagnetic layer; and
    an electrically conductive capping layer on the free ferromagnetic layer, the capping layer comprising a first layer selected from the group consisting of a tantalum nitride and a tungsten nitride and a second layer selected from the group consisting of tungsten and tantalum located on and in contact with the first layer, the first layer of the capping layer being located on and in contact with the free ferromagnetic layer.

2. The magnetic tunnel junction cell of claim 1 wherein the first layer of the underlayer is tantalum nitride having tantalum present between 33 and 50 atomic percent and wherein the second layer of the underlayer is the alpha phase of tantalum.

3. The magnetic tunnel junction cell of claim 1 further comprising a layer of antiferromagnetic material between the second layer of the underlayer and the pinned ferromagnetic layer, the pinned ferromagnetic layer's moment being fixed by being exchange biased with the antiferromagnetic layer.

4. The magnetic tunnel junction cell of claim 3 wherein the antiferromagnetic material is selected from the group consisting of an alloy comprising Ir and Mn and an alloy comprising Pt and Mn.

5. The magnetic tunnel junction cell of claim 1 wherein the pinned ferromagnetic layer comprises two ferromagnetic films separated by an antiferromagnetically coupling spacer film, the magnetic moments of the two ferromagnetic films being oriented antiparallel.

6. A magnetic tunnel junction cell comprising:
    a substrate;
    an electrically conductive underlayer comprising a bilayer of a tantalum nitride layer on the substrate and a layer of alpha-phase tantalum on and in contact with the tantalum nitride layer;
    a layer of antiferromagnetic material on the tantalum layer of the underlayer, the antiferromagnetic material being an alloy comprising Pt and Mn;
    a pinned ferromagnetic layer on and in contact with the antiferromagnetic layer and whose magnetic moment is pinned by being exchange biased with the antiferromagnetic layer;
    a free ferromagnetic layer having its magnetic moment free to rotate in the presence of an applied magnetic field;
    a tunnel barrier layer located between the pinned ferromagnetic layer and the free ferromagnetic layer; and
    an electrically conductive capping layer comprising a bilayer of a tantalum nitride layer on the free ferromagnetic layer and a layer of alpha-phase tantalum on and in contact with the tantalum nitride layer.

7. The magnetic tunnel junction cell of claim 6 further comprising a first line of copper on the substrate beneath and in contact with the tantalum nitride layer of the underlayer and a second line of copper on and in contact with the tantalum layer of the capping layer.

8. A magnetic memory array of magnetic tunnel junction memory cells comprising:
    a planar silicon substrate;
    insulating material formed on the substrate;
    a first set of copper lines in the insulating material and spaced vertically from the planar substrate, the first set of lines being electrically connected to regions of the substrate;
    a second set of copper lines in the insulating material and spaced vertically from the planar substrate and from the first set of copper lines, the spacing between the first and second sets of lines defining a plurality of intersection regions;
    an array of magnetic tunnel junction cells, each cell being near an intersection region and comprising
        an electrically conductive bilayer underlayer comprising a tantalum nitride layer electrically connected to one of the lines of the first set and a layer of alpha-phase tantalum on and in contact with the tantalum nitride layer;
        a layer of antiferromagnetic material on the tantalum layer of the underlayer, the antiferromagnetic material being an alloy comprising Pt and Mn;
        a pinned ferromagnetic layer on and in contact with the antiferromagnetic layer and whose magnetic moment is pinned by being exchange biased with the antiferromagnetic layer;
        a free ferromagnetic layer having its magnetic moment free to rotate in the presence of an applied magnetic field;

a tunnel barrier layer located between the pinned ferromagnetic layer and the free ferromagnetic layer; and an electrically conductive bilayer capping layer comprising a tantalum nitride layer on the free ferromagnetic layer and a layer of alpha-phase tantalum on and in contact with the tantalum nitride layer;

and wherein the tantalum layer of the capping layer is electrically connected to one of the lines of the second set.

9. The memory array of claim 8 further comprising a plurality of electrically conductive studs, each stud being oriented vertically from the planar substrate and located in a via of the insulating material, wherein one of the studs is spaced horizontally from one of the cells, and wherein both the tantalum nitride layer and the tantalum layer of the underlayer extend between and electrically connect said one cell and said one stud.

\* \* \* \* \*